US008871582B2

(12) United States Patent
Pham et al.

(10) Patent No.: US 8,871,582 B2
(45) Date of Patent: Oct. 28, 2014

(54) METHODS OF FORMING A SEMICONDUCTOR DEVICE WITH A PROTECTED GATE CAP LAYER AND THE RESULTING DEVICE

(71) Applicants: GlobalFoundries Inc., Grand Cayman (KY); International Business Machines Corporation, Armonk, NY (US)

(72) Inventors: Daniel Pham, Clifton Park, NY (US); Xiuyu Cai, Niskayuna, NY (US); Balasubramanian Pranatharthiharan, Watervliet, NY (US); Pranita Kulkarni, Hopewell Junction, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/839,626

(22) Filed: Mar. 15, 2013

(65) Prior Publication Data

US 2014/0264486 A1    Sep. 18, 2014

(51) Int. Cl.
*H01L 29/78* (2006.01)
*H01L 21/28* (2006.01)
*H01L 29/423* (2006.01)

(52) U.S. Cl.
CPC ...... *H01L 29/4232* (2013.01); *H01L 21/28247* (2013.01); *H01L 29/78* (2013.01)
USPC ........... 438/190; 438/197; 438/149; 438/151; 438/157

(58) Field of Classification Search
CPC ............ H01L 21/02362; H01L 21/563; H01L 21/823842; H01L 29/78731
USPC ............. 257/288; 48/190, 197, 149, 151, 157
See application file for complete search history.

(56) References Cited

U.S. PATENT DOCUMENTS

| 7,026,197 B2 | 4/2006 | Nakajima et al. ............. 438/153 |
| 7,984,408 B2 * | 7/2011 | Cheng et al. .................. 716/119 |
| 2012/0015492 A1 | 1/2012 | Inagawa et al. ............... 438/270 |
| 2013/0181265 A1 * | 7/2013 | Grasshoff et al. ............ 257/288 |
| 2013/0249020 A1 | 9/2013 | Cheng et al. .................. 257/407 |

OTHER PUBLICATIONS

Office Action from related U.S. Appl. No. 13/839,802 dated Jun. 12, 2014.

* cited by examiner

*Primary Examiner* — Kevin M Picardat
*Assistant Examiner* — Damian A Hillman
(74) *Attorney, Agent, or Firm* — Amerson Law Firm, PLLC (57) ABSTRACT

One method includes forming a recessed gate/spacer structure that partially defines a spacer/gate cap recess, forming a gate cap layer in the spacer/gate cap recess, forming a gate cap protection layer on an upper surface of the gate cap layer, and removing portions of the gate cap protection layer, leaving a portion of the gate cap protection layer positioned on the upper surface of the gate cap layer. A device disclosed herein includes a gate/spacer structure positioned in a layer of insulating material, a gate cap layer positioned on the gate/spacer structure, wherein sidewalls of the gate cap layer contact the layer of insulating material, and a gate cap protection layer positioned on an upper surface of the gate cap layer, wherein the sidewalls of the gate cap protection layer also contact the layer of insulating material.

13 Claims, 9 Drawing Sheets

METHODS OF FORMING A SEMICONDUCTOR DEVICE WITH A PROTECTED GATE CAP LAYER AND THE RESULTING DEVICE

BACKGROUND OF THE INVENTION

1. Field of the Invention

The present disclosure generally relates to the fabrication of integrated circuits, and, more particularly, to various methods of forming a semiconductor device with a protected gate cap layer, and the resulting semiconductor device.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times ($2x$) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

By using such field effect transistors, more complex circuit components may be composed, such as inverters and the like, thereby forming complex logic circuitry, embedded memories and the like. Over the recent years, due to the reduced dimensions of the transistor devices, the operating speed of the circuit components has been increased with every new device generation and the "packing density" in such products has been increased over the recent years. Such improvements in the performance of transistor devices has reached the point where the limiting factor of the finally achieved operating speed of complex integrated circuit products is no longer the individual transistor element but the electrical performance of the complex wiring system that is formed above the device level including the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromi-gration behavior as is required in view of reliability of the integrated circuits. Consequently, in lower-lying metallization levels, metal lines and vias having critical dimensions of approximately 100 nm and significantly less may have to be provided in order to achieve the required packing density in accordance with density of circuit elements in the device level.

As device dimensions have decreased, e.g., transistors with gate lengths of 50 nm and less, the contact elements in the contact level have to be provided with critical dimensions on the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the contact regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the gate electrode structures, i.e., the portions exposed by the global contact opening, as an etch mask. Thereafter, an appropriate contact material, such as tungsten and the like, may be filled into the contact trenches.

Figure 1A:
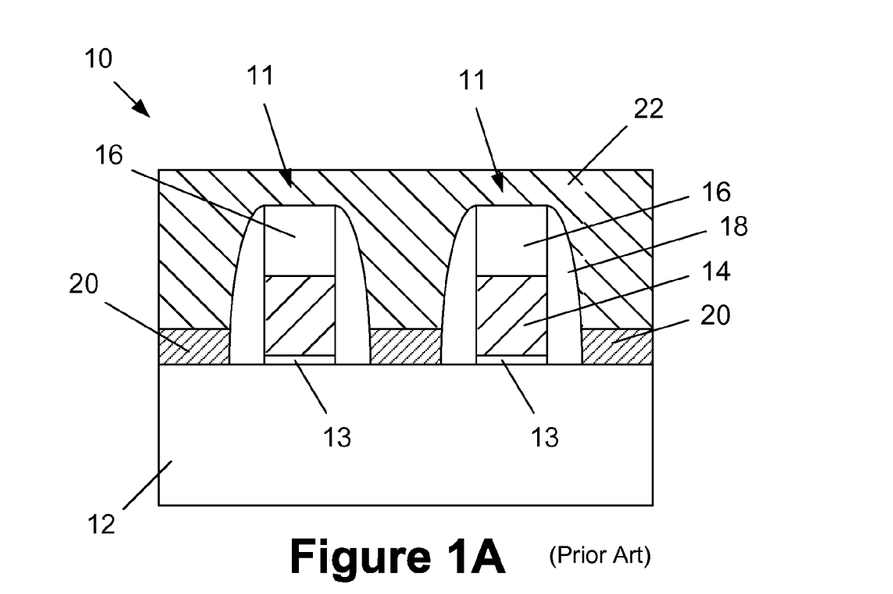
FIGS. 1A-1B schematically illustrate a cross-sectional view of an illustrative prior art integrated circuit product that employs self-aligned contacts.
Figure 1B:
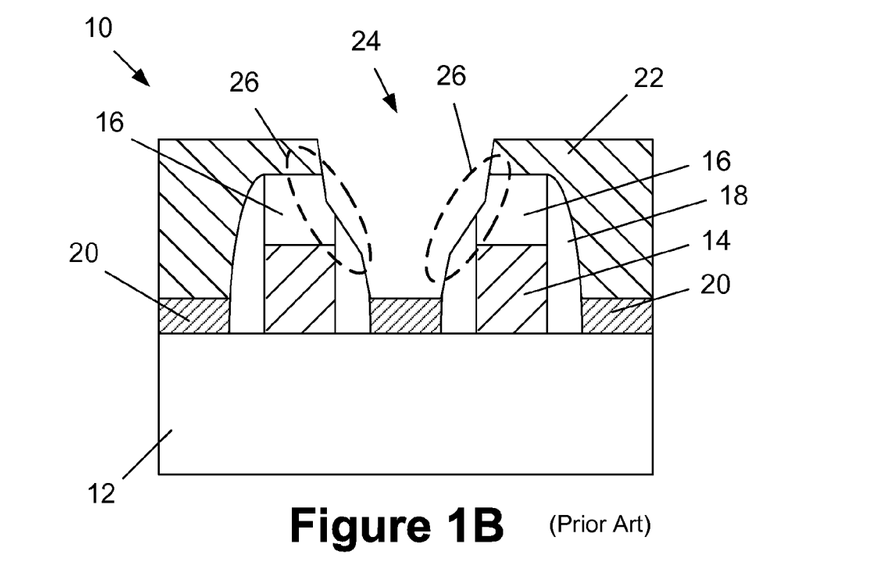

However, the aforementioned process of forming self-aligned contacts results in an undesirable loss of the materials that protect the conductive gate electrode, i.e., the gate cap layer and the sidewall spacers, as will be explained with reference to FIGS. 1A-1B. FIG. 1A schematically illustrates a cross-sectional view of an integrated circuit product 10 at an advanced manufacturing stage. As illustrated, the product 10 comprises a plurality of illustrative gate structures 11 that are formed above a substrate 12, such as a silicon substrate. The gate structures 11 are comprised of an illustrative gate insulation layer 13 and an illustrative gate electrode 14. An illustrative gate cap layer 16 and sidewall spacers 18 encapsulate and protect the gate structures 11. The gate cap layer 16 and sidewall spacers 18 are typically made of silicon nitride. Also depicted in FIG. 1A are a plurality of raised source/drain regions 20 and a layer of insulating material 22, e.g., silicon dioxide. FIG. 1B depicts the product 10 after an opening 24 has been formed in the layer of insulating material 22 for a self-aligned contact. Although the contact etch process performed to form the opening 24 is primarily directed at removing the desired portions of the layer of insulating material 22, portions of the protective gate cap layer 16 and the protective sidewall spacers 18 get consumed during the contact etch process, as simplistically depicted in the dashed regions 26. Given that the cap layer 16 and the spacers 18 are attacked in the contact etch process, the thickness of these protective materials must be sufficient such that, even after the contact etch process is completed, there remains sufficient material to protect the gate structures 11. Accordingly, device manufacturers tend to make the cap layers 16 and spacers 18 having an additional thickness that may otherwise not be required but for the consumption of the cap layers 16 and the spacers 18 during the contact etch process. In turn, increasing the thickness of such structures, i.e., increasing the thickness of the gate cap layers 16, causes other problems, such as increasing the aspect ratio of the contact opening 24 due to the increased height, increasing the initial gate height, which makes the gate etching and spacer etching processes more difficult, etc.

The present disclosure is directed to various methods of forming a semiconductor device with a protected gate cap layer, and the resulting semiconductor device, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a semiconductor device with a protected gate cap layer, and the resulting semiconductor device. One illustrative method disclosed herein includes performing at least one etching process to recess a gate structure and a spacer structure of a transistor to thereby form a recessed gate structure and a recessed spacer structure, wherein the recessed gate structure, the recessed spacer structure and a layer of insulating material define a spacer/gate cap recess, forming a gate cap layer in the spacer/gate cap recess, wherein the gate cap layer has a thickness that is less than a depth of the spacer/gate cap recess, forming a gate cap protection layer on an upper surface of the gate cap layer and above the layer of insulating material and performing at least one process operation to remove portions of the gate cap protection layer from above the layer of insulating material while leaving a portion of the gate cap protection layer positioned on the upper surface of the gate cap layer.

A further illustrative method disclosed herein includes performing at least one etching process to recess a gate structure and a spacer structure of a transistor to thereby form a recessed gate structure and a recessed spacer structure, wherein the recessed gate structure, the recessed spacer structure and a layer of insulating material define a spacer/gate cap recess, forming a first gate cap protection layer above the layer of insulating material and in the spacer/gate cap recess, forming a gate cap layer in the spacer/gate cap recess above the first gate cap protection layer, wherein an upper surface of the gate cap layer is positioned below an upper surface of the layer of insulating material, forming a second gate cap protection layer on the upper surface of the gate cap layer and above at least the layer of insulating material and performing at least one process operation to remove portions of the first and second gate cap protection layers from above the layer of insulating material while leaving a portion of the second gate cap protection layer positioned on the upper surface of the gate cap layer.

One illustrative example of a novel transistor device disclosed herein includes a gate structure positioned above a semiconductor substrate, a spacer structure positioned adjacent the gate structure, a layer of insulating material positioned above the substrate and around the spacer structure, a gate cap layer positioned on the gate structure and the spacer structure, wherein the sidewalls of the gate cap layer contact the layer of insulating material, and a gate cap protection layer positioned on an upper surface of the gate cap layer, wherein the sidewalls of the gate cap protection layer also contact the layer of insulating material.

Another novel transistor device disclosed herein includes a gate structure positioned above a semiconductor substrate, a spacer structure positioned adjacent the gate structure, a layer of insulating material positioned above the substrate and around the spacer structure, a first gate cap protection layer positioned on the gate structure, the spacer structure and portions of the layer of insulating material, a gate cap layer positioned on the first gate cap protection layer, wherein the sidewalls and a bottom surface of the gate cap layer each contact the first gate cap protection layer, and a second gate cap protection layer positioned on an upper surface of the gate cap layer, wherein the first and second gate cap protection layers encapsulate the gate cap layer.

Yet another novel transistor device disclosed herein includes a gate structure positioned above a semiconductor substrate, a spacer structure positioned adjacent the gate structure, a layer of insulating material positioned above the substrate and around the spacer structure, a gate cap layer positioned above the gate structure and the spacer structure, and a gate cap protection material that encapsulates the gate cap layer, wherein portions of the gate cap protection material are positioned between the gate cap layer and the gate structure, the spacer structure and the layer of insulating material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a semiconductor device with a protected gate cap layer, and the resulting semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

Figure 2A:
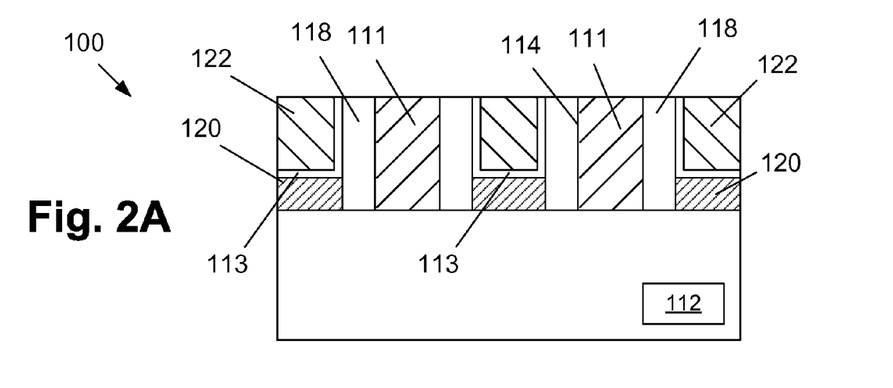
FIGS. 2A-2K depict one illustrative method disclosed herein of forming a semiconductor device with a protected gate cap layer, and the resulting semiconductor device.

FIG. 2A schematically illustrates a cross-sectional view of an integrated circuit product 100 at an advanced stage of manufacturing. As illustrated, the product 100 comprises a plurality of illustrative gate structures 111 that are formed above a substrate 112. The substrate 112 may have a variety of configurations, such as the depicted bulk substrate configuration. The substrate 112 may have an SOI (silicon-on-insulator) configuration wherein the semiconductor devices are formed in the active layer of the SOI substrate. The substrate 112 may be made of silicon or it may be made of materials other than silicon. Thus, the terms "substrate," "semiconductor substrate" or "semiconducting substrate" should be understood to cover all semiconducting materials and all forms of such materials. The inventions disclosed herein will be disclosed in the context of forming planar transistor devices. However, as will be recognized by those skilled in the art after a complete reading of the present application, the inventions disclosed herein may be applied to the formation of planar FET devices as well as 3D devices, such as FinFET devices. Moreover, the methods disclosed herein are applicable to forming any type of device, e.g., an NFET device, a PFET device, etc.

With continuing reference to FIG. 2A, the gate structures 111 are intended to be representative in nature of any type of gate structure that may be employed in manufacturing integrated circuit products using so-called gate-first or gate-last (replacement-gate) manufacturing techniques. In general, the gate structures 111 are comprised of one or more gate insulation layers (not shown), such as, for example, silicon dioxide, a so-called high-k (k greater than 10) insulation material (where k is the relative dielectric constant), etc., and one or more conductive material layers that act as the gate electrode, e.g., titanium nitride, tantalum nitride, tungsten, aluminum, polysilicon, etc. In general, in an illustrative replacement-gate manufacturing technique, a so-called "dummy" or sacrificial gate structure (not shown) including a gate cap layer is initially formed above the substrate 112 and patterned. Thereafter, the sidewall spacers 118 are formed adjacent the patterned dummy gate structure/cap layer. The dummy gate structure remains in place as many process operations are performed to form the device, e.g., the formation of raised, doped source/drain regions, performing an anneal process to repair damage to the substrate caused by the ion implantation processes and to activate the implanted dopant materials. At some point in the process flow, the gate cap layer is removed by performing a chemical mechanical polishing (CMP) process relative to a layer of insulating material so as to expose the dummy gate structure for further processing. Thereafter, one or more etching processes are performed to remove the dummy gate structure which results in the formation of a gate cavity 114 (see FIG. 2A) that is laterally defined by the spacers 118 where the gate structure 111 for the device is formed. For example, after the dummy gate is removed, a conformal chemical vapor deposition (CVD) or atomic layer deposition (ALD) process may be performed to conformably deposit a gate insulation layer comprised of a high-k layer of insulating material, e.g., hafnium oxide, in the gate cavity. Thereafter, one or more metal or metal alloy layers and/or polysilicon layers (that will become the gate electrode) may be deposited in the gate cavity 114 above the gate insulation layer. A CMP process is then performed to remove excess portions of the deposited layers of material positioned outside the gate cavity 114. These operations result in the schematically depicted gate structures 111.

While still referencing FIG. 2A, the illustrative sidewall spacers 118 that were formed adjacent the dummy gate structure (not shown), e.g., silicon nitride spacers, encapsulate and protect portions of the gate structure 111. The spacers 118 were formed by depositing a layer of spacer material adjacent the dummy gate structure and thereafter performing an anisotropic etching process on the layer of spacer material. Also depicted in FIG. 2A are a plurality of raised source/drain regions 120, an etch stop layer 113, e.g., silicon nitride, and a layer of insulating material 122, e.g., silicon dioxide. The raised source/drain regions 120 are provided by way of example, as the inventions disclosed herein may be employed with devices having any type of source/drain regions, e.g., raised or planar. The raised source/drain regions 120 may be formed by performing a variety of known process operations. The etch stop layer 113 may be formed by performing a conformal deposition process, e.g., CVD, ALD, and its thickness may vary depending upon the particular application. FIG. 2A depicts the device 100 in the illustrative case where the gate structures 111 are formed using a replacement gate manufacturing technique after several process operations have been performed, i.e., gate cap removal, dummy gate removal to thereby define the gate cavities 114 (between the spacers 118) where the final gate structures 111 will be formed, formation of various layers of material that will make up the gate structure 111 and after a CMP process was performed. Thus, in FIG. 2A, the upper surface of the gate structures 111 is exposed.

Figure 2B:
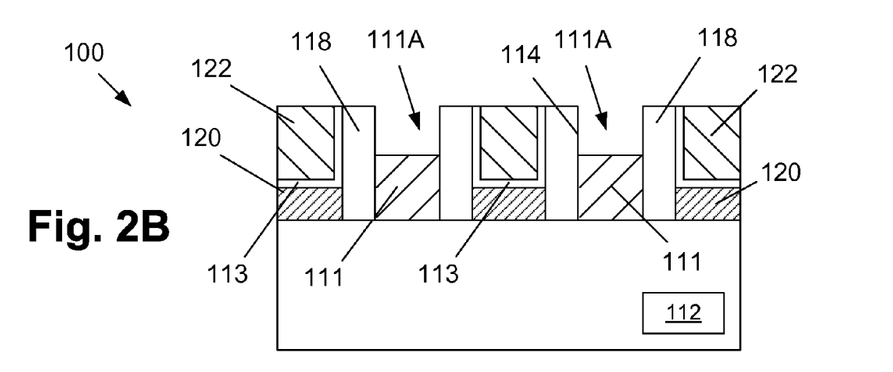

FIG. 2B depicts the product 100 after a timed recess etching process has been performed to selectively remove portions of the gate structures 111 to thereby define a gate cap recess 111A, the depth of which may vary depending upon the particular application. In one illustrative embodiment, the gate cap recess 111A may have a depth on the order of about 5-20 nm relative to the upper surface of the layer of insulating material 122. In one illustrative embodiment, the etching process performed to form the gate cap recesses 111A may be an anisotropic etching process.

Figure 2C:
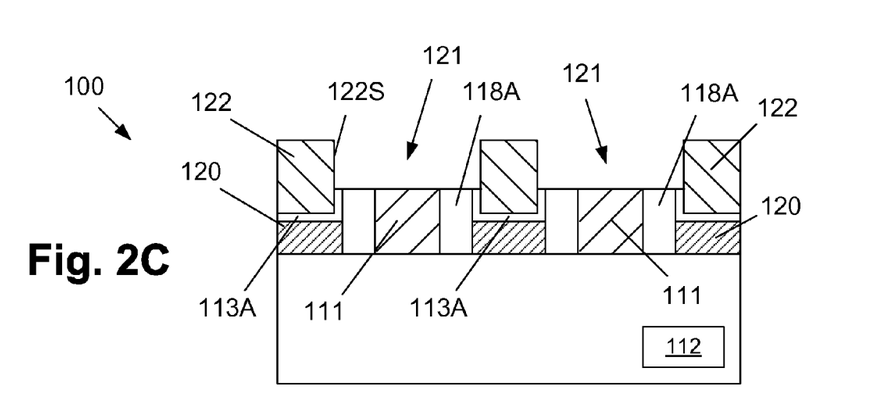

FIG. 2C depicts the product 100 after one or more timed recess etching processes have been performed to selectively remove portions of the sidewall spacers 118 and the etch stop layer 113 to thereby define recessed sidewall spacers 118A and a recessed etch stop layer 113A. The recessing operations, in combination with those described in FIG. 2B above, define a spacer/gate cap recess 121, the depth of which may vary depending upon the particular application. In one illustrative embodiment, the spacer/gate cap recess 121 may have a depth on the order of about 5-20 nm relative to the upper surface of the layer of insulating material 122. In one illustrative embodiment, the etching process(es) performed to form the spacer/gate cap recess 121 may be an anisotropic etching process and the sidewall surface 122S of the layer of insulating material 122 may be exposed at the point of fabrication depicted in FIG. 2C. Of course, as will be recognized by those skilled in the art after a complete reading of the present application, if desired, the spacers 118 may be recessed prior to recessing the gate structure 111.

Figure 2D:
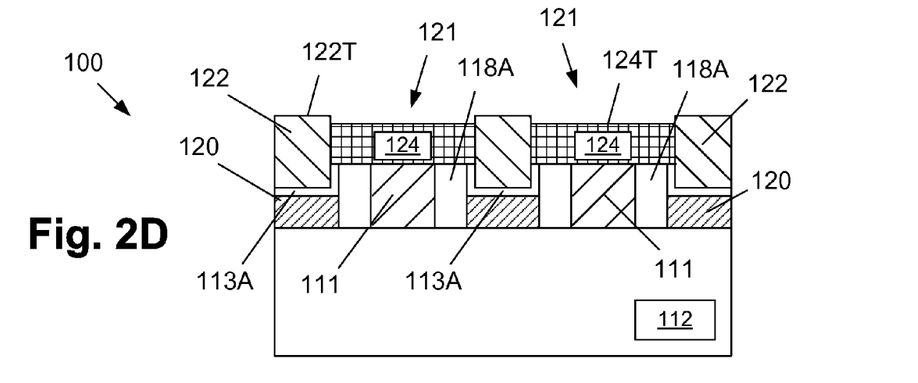

FIG. 2D depicts the product 100 after a gate cap layer 124 has been formed in each spacer/gate cap recess 121. The gate cap layers 124 were formed by depositing a layer of gate cap material, e.g., a flowable oxide, a low-k insulating material (which for purposes of the inventions disclosed herein will be understood to have a k-value less than 7), so as to overfill the spacer/gate cap recess 121, and thereafter performing a CMP process to remove the excess gate cap material using the layer of insulating material 122 as a polish-stop layer. In some very specific applications, the gate cap layers 124 may be formed from a material having a k-value less than 3.3. Thereafter, as reflected in FIG. 2D, a brief etching process is performed so as to slightly recess the gate cap layers 124 relative to the upper surface 122T of the layer of insulating material 122. In one illustrative embodiment, the upper surface 124T of the gate cap layers 124 may be about 1-5 nm below the upper surface 122T of the layer of insulating material 122. In some applications, the above-described CMP process may be omitted and the structure depicted in FIG. 2D may be achieved by depositing the gate cap material and thereafter performing an etch-back process.

Figure 2E:
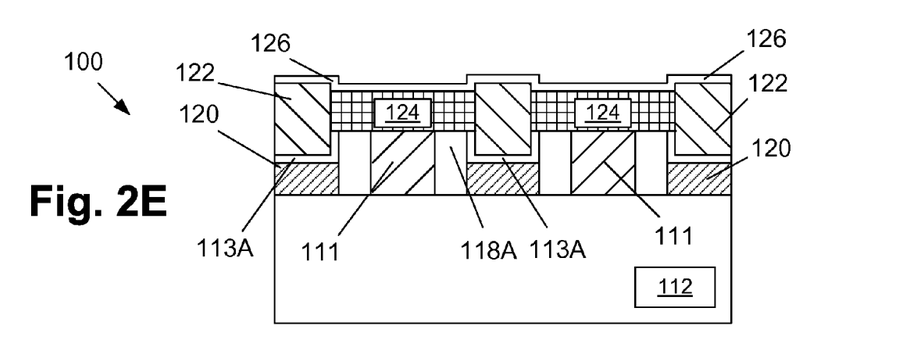

FIG. 2E depicts the product 100 after a gate cap protection layer 126 has been deposited across the product 100 and on the gate cap layers 124. The gate cap protection layer 126 may be comprised of a variety of different materials that exhibit good etch selectivity relative to the layer of insulating material 122. In one illustrative embodiment, the gate cap protection layer 126 may be comprised of, for example, hafnium oxide, aluminum oxide, other high etch resistance metal oxides, or a material having a dielectric constant greater than 10. In various embodiments disclosed herein, the gate cap protection layer 126 will be comprised of a material having a higher k-value than the material of the gate cap layer 124. The gate cap protection layer 126 may be formed by performing a variety of techniques, e.g., CVD, ALD, etc. The thickness of the gate cap protection layer 126 may vary depending upon the particular application, e.g., 2-8 nm.

Figure 2F:
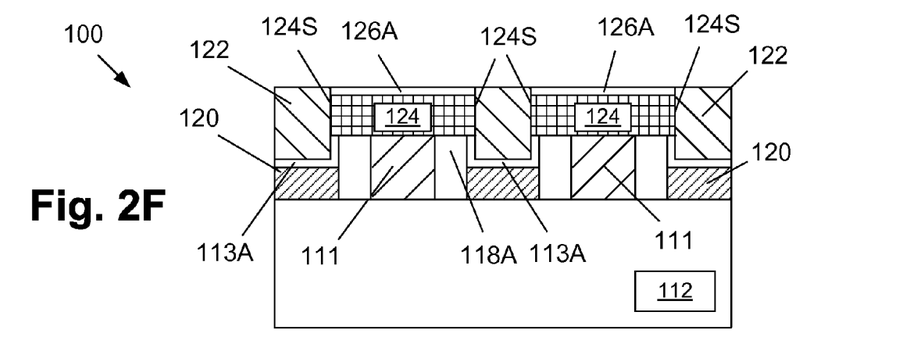

FIG. 2F depicts the product 100 after a CMP process was performed to remove portions of the gate cap protection layer 126 positioned above the layer of insulating material 122. This process operation results in a portion 126A of the gate cap protection layer 126 covering the entire upper surface of the gate cap layer 124.

Figure 2G:
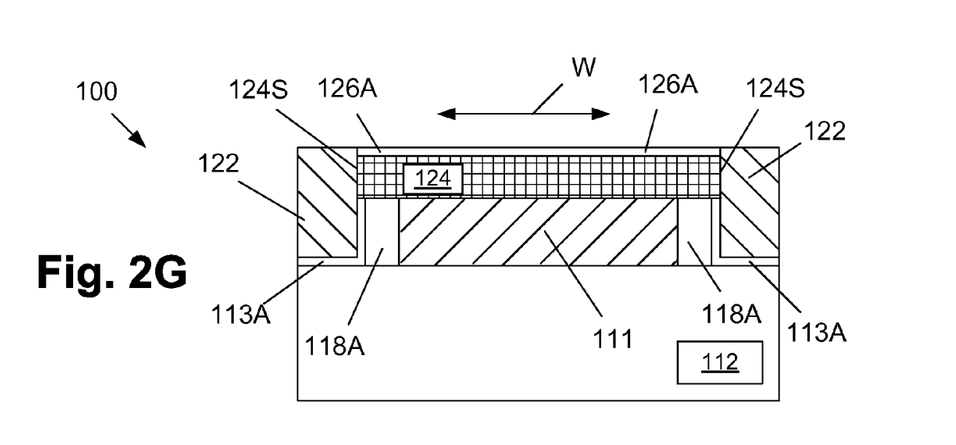

FIG. 2G is a cross-sectional view taken through the gate structure 111 of one of the transistors in the gate width (W) direction of the transistor. As can be seen in FIGS. 2F-2G, in this particular embodiment, the sidewalls 124S of the gate cap layer 124 contact the layer of insulating material 122, i.e., the entire perimeter of the gate cap layer 124 contacts the layer of insulating material 122. Additionally, the sidewalls of the protection layer 126 also contact the layer of insulating material 122.

Figure 2H:
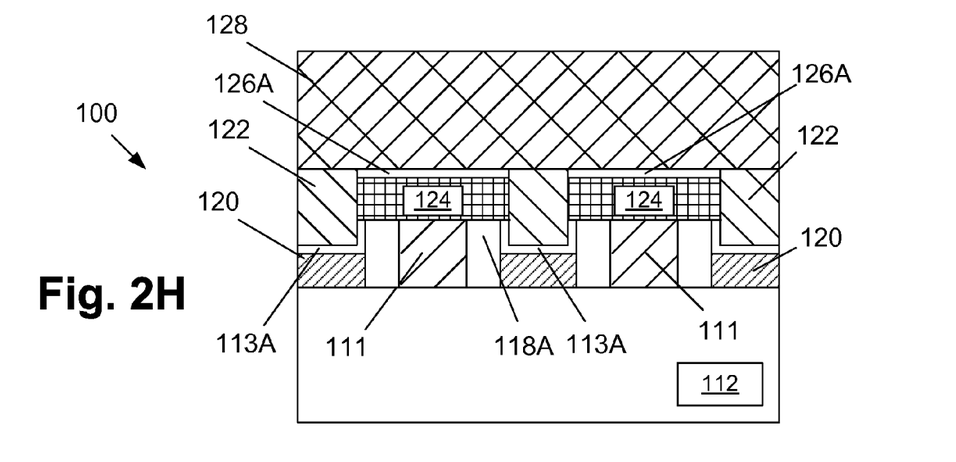

FIG. 2H depicts the product 100 after a layer of insulating material 128 has been deposited across the product 100. The layer of insulating material 128 may be comprised of a variety of different materials, such as silicon dioxide, a low-k (k value less than 3.3) material, etc., and it may be formed by performing a variety of techniques, e.g., CVD, etc. The thickness of the layer of insulating material 128 may vary depending upon the particular application.

Figure 2I:
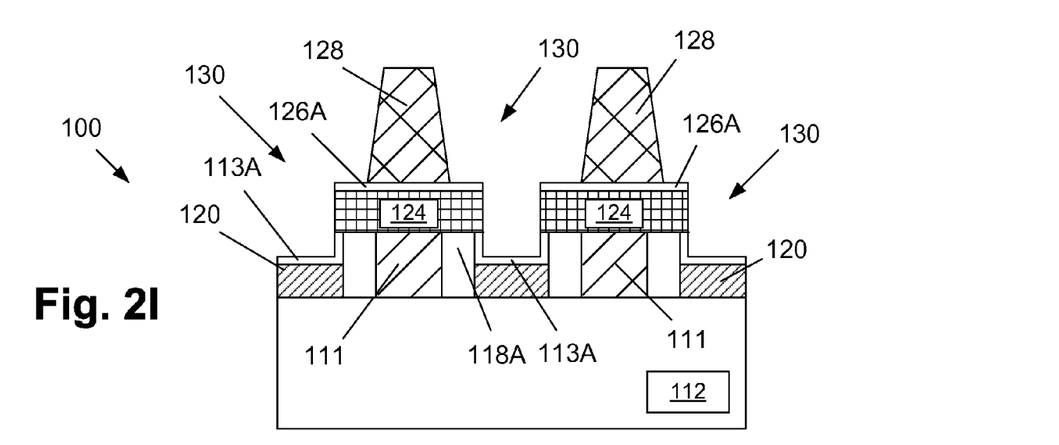

FIG. 2I depicts the product 100 after one or more anisotropic etching processes were performed on the product 100 through a patterned etch mask (not shown), such as a patterned layer of photoresist material, to remove portions of the layer of insulating material 128 and substantially all of the layer of insulating material 122 to thereby define a plurality of self-aligned contact openings 130. In the depicted example, the self-aligned contact openings 130 are depicted as being precisely aligned relative to the gate structures 111. However, in a real-world device, the self-aligned contact openings 130 may be somewhat misaligned relative to the gate structures 111. During the formation of the self-aligned contact openings 130, the portions 126A of the gate cap protection layer 126 protect the gate cap layer 124. Note that the recessed etch stop layer 113A remains in place at this point in the process flow to protect the raised source/drain regions 120 during the etching process(es).

Figure 2J:
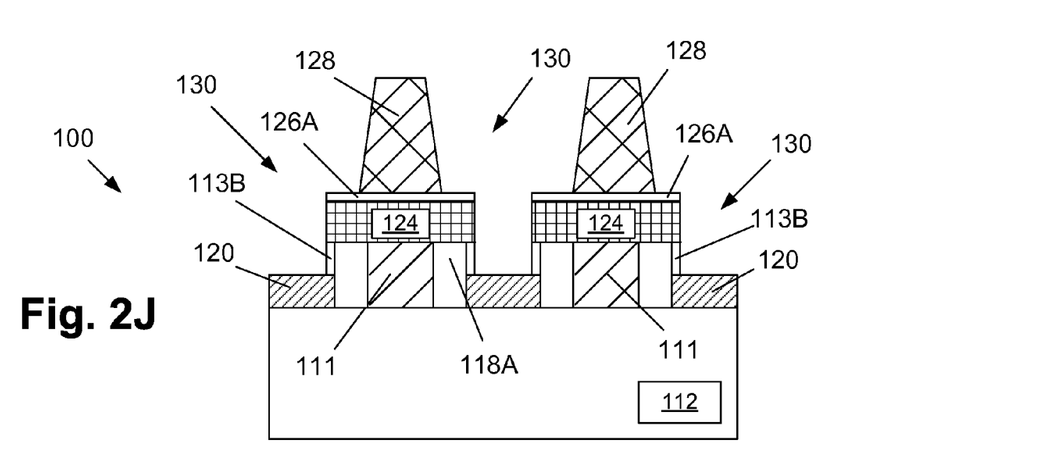

FIG. 2J depicts the device 100 after a very brief "punch through" etching process is performed to remove at least portions of the recessed etch stop layer 113A (as well as any other residual materials) so as to thereby expose the source/drain regions 120. In some cases, portions 113B of the recessed etch stop layer 113A may remain in place as depicted in FIG. 2I. In other cases, substantially all of the recessed etch stop layer 113A may be removed during this punch through etching process.

Figure 2K:
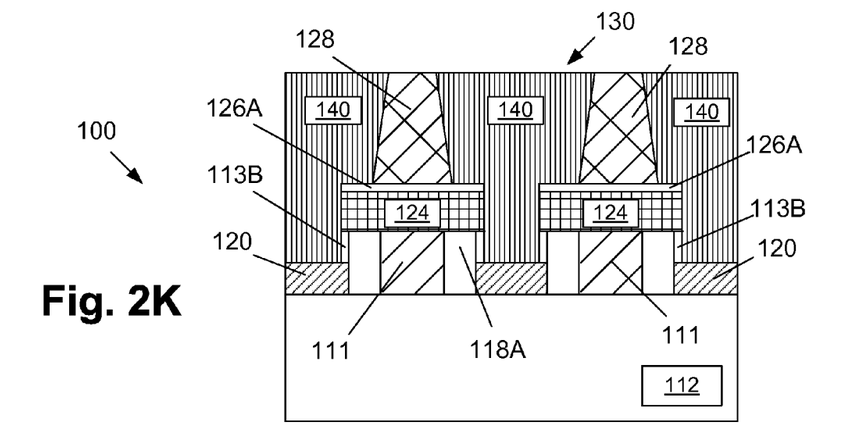

FIG. 2K depicts the product 100 after conductive, self-aligned contact structures 140 have been formed in the self-aligned contact openings 130 such that they are conductively coupled to the source/drain regions 120. The self-aligned contact structures 140 are intended to be schematic and representative in nature, as they may be formed using any of a variety of different conductive materials and by performing traditional manufacturing operations. The self-aligned contact structures 140 may also contain one or more barrier layers (not depicted). In one illustrative example, the self-aligned contact structures 140 may be formed by depositing a liner, e.g., a titanium nitride liner, followed by overfilling the self-aligned contact openings 130 with a conductive material, such as tungsten. Thereafter, a CMP process may be performed to planarize the upper surface of the layer of insulating material 128 which results in the removal of excess portions of the liner and the tungsten positioned above the layer of insulating material 128 outside of the self-aligned contact openings 130 and the formation of the self-aligned contact structures 140. If desired, a metal silicide material (not shown) may be formed on the source/drain regions 120 prior to forming the self-aligned contact structures 140.

Figure 3A:
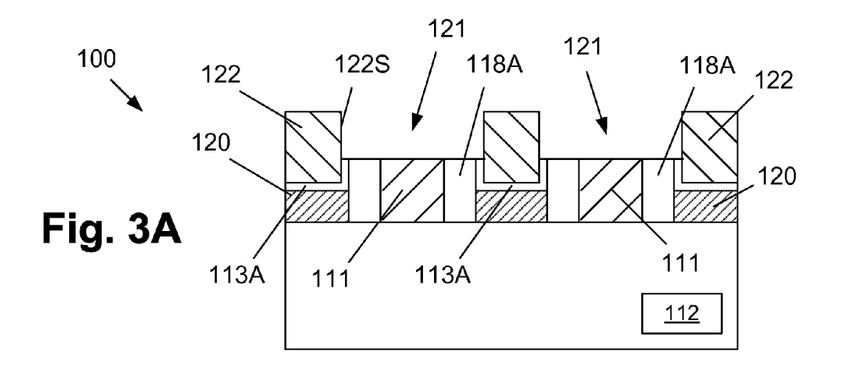
FIGS. 3A-3J depict another illustrative method disclosed herein of forming a semiconductor device with a protected gate cap layer, and the resulting semiconductor device.

FIGS. 3A-3J depict another illustrative method disclosed herein of forming a semiconductor device with a protected gate cap layer, and the resulting semiconductor device. FIG. 3A depicts the device 100 at a point of fabrication that approximately corresponds to that of the device depicted in FIG. 2C, i.e., after gate structure 111 and the spacers 118 have been recessed.

Figure 3B:
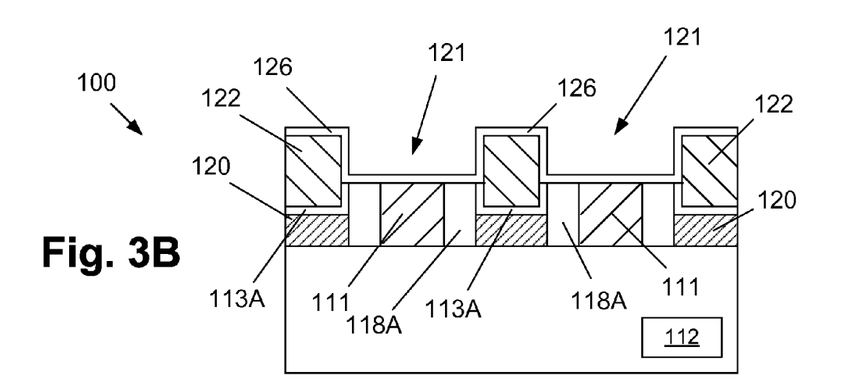

FIG. 3B depicts the product 100 after the above-described gate cap protection layer 126 was formed across the product and in the spacer/gate cap recesses 121.

Figure 3C:
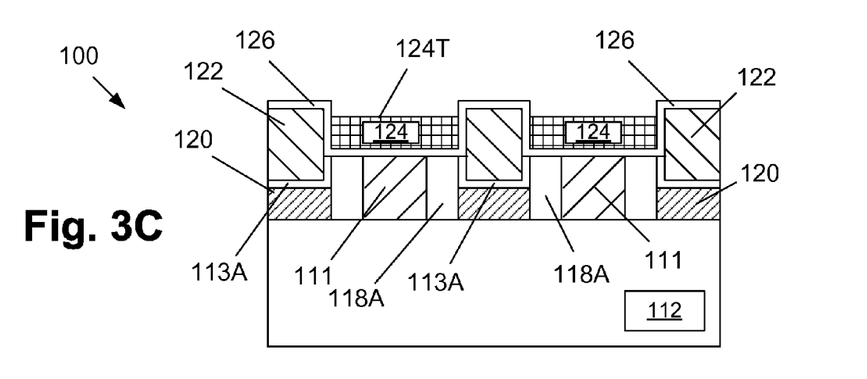

FIG. 3C depicts the product 100 after the above-described gate cap layers 124 were formed in the spacer/gate cap recesses 121 above the gate cap protection layer 126. The gate cap layers 124 may be recessed as described previously with respect to the upper surface of the layer of insulating material 122. At this point in fabrication, all of the surfaces of the gate cap layers 124, other than the top or upper surface 124T of the gate cap layers 124, are covered by or contacted by the gate cap protection layer 126. The sidewalls and the bottom surface of the gate cap layer 124 contacts the gate cap protection layer 126.

Figure 3D:
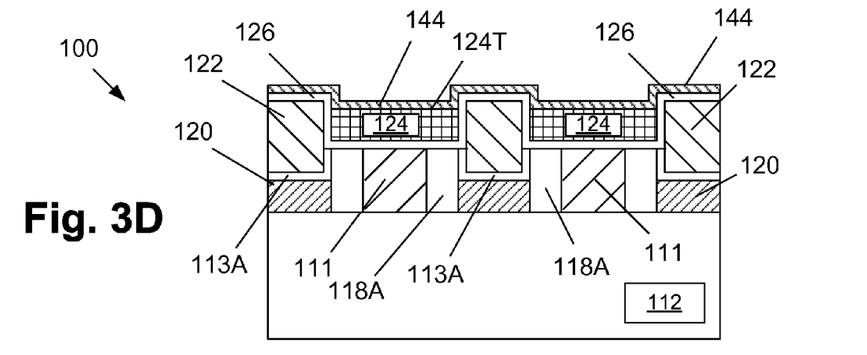

FIG. 3D depicts the product 100 after another gate cap protection layer 144 was formed across the device 100 and on the exposed upper surfaces 124T of the gate cap layers 124. Relative to the gate cap protection layer 126, the gate cap protection layer 144 may be comprised of the same materials, it may be formed using similar manufacturing methods and it may have a similar thickness. In one illustrative embodiment, the gate cap protection layers 126, 144 may be made of the same material, although that may not be the case in other applications, e.g., in some cases, the materials selected for the gate cap protection layers 126, 144 may be different.

Figure 3E:
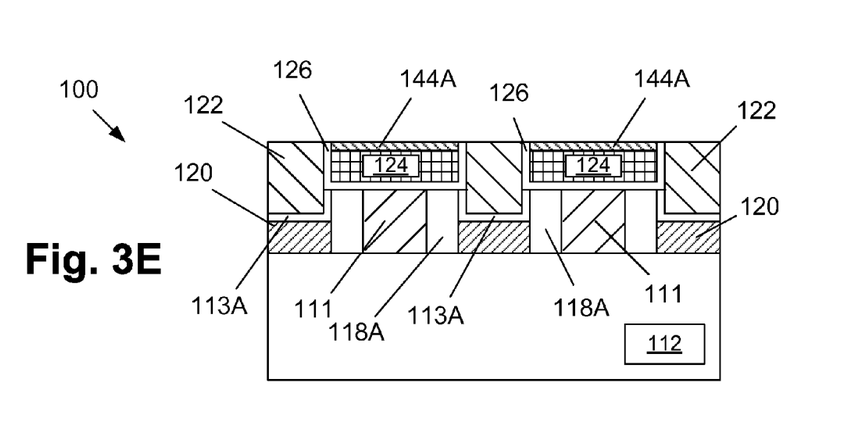

FIG. 3E depicts the product 100 after a CMP process was performed to remove portions of the gate cap protection layer 144 positioned above the layer of insulating material 122. This process operation results in a portion 144A of the gate cap protection layer 144 covering the entire upper surface of the gate cap layer 124. As will be appreciated by those skilled in the art, at this point in fabrication, the gate cap layers 124 are encapsulated by a combination of the gate cap protection layers 126, 144A.

Figure 3F:
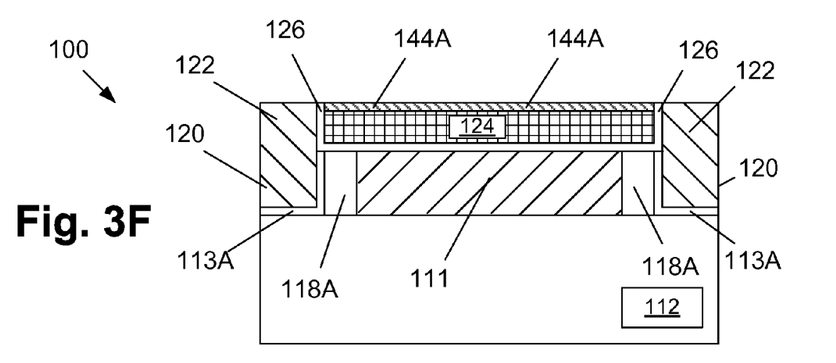

FIG. 3F is a cross-sectional view taken through the gate structure 111 of one of the transistors in the gate width (W) direction of the transistor. As can be seen in FIGS. 3E-3F, in this particular embodiment, the gate cap layer 124 is encapsulated by a combination of the gate cap protection layers 126, 144A. In one particular example, the material(s) of the gate cap protection layers 126, 144A may be made of materials having a higher k-value than the material of the gate cap layer 124. Stated another way, in one illustrative embodiment, the gate cap protection layers 126, 144A constitute gate cap protection material that encapsulates the gate cap layer 124, wherein the dielectric constant of the gate cap protection material(s) is greater than the dielectric constant of the gate cap material.

Figure 3G:
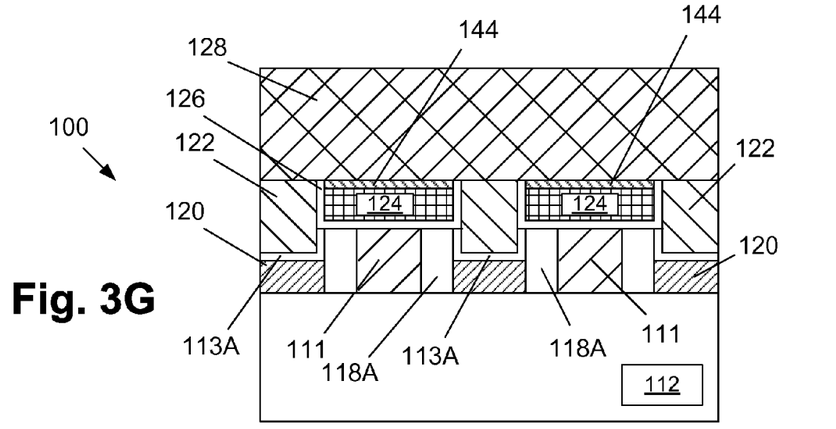

FIG. 3G depicts the product 100 after the above-described layer of insulating material 128 was deposited across the product 100.

Figure 3H:
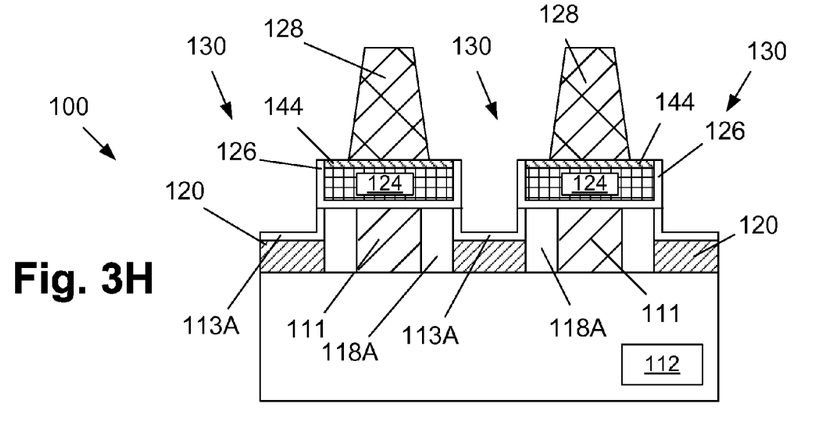

FIG. 3H depicts the product 100 after one or more anisotropic etching processes were performed on the product 100 through a patterned etch mask (not shown), such as a patterned layer of photoresist material, to remove portions of the layer of insulating material 128 and substantially all of the layer of insulating material 122 to thereby define a plurality of the above-described self-aligned contact openings 130.

Figure 3I:
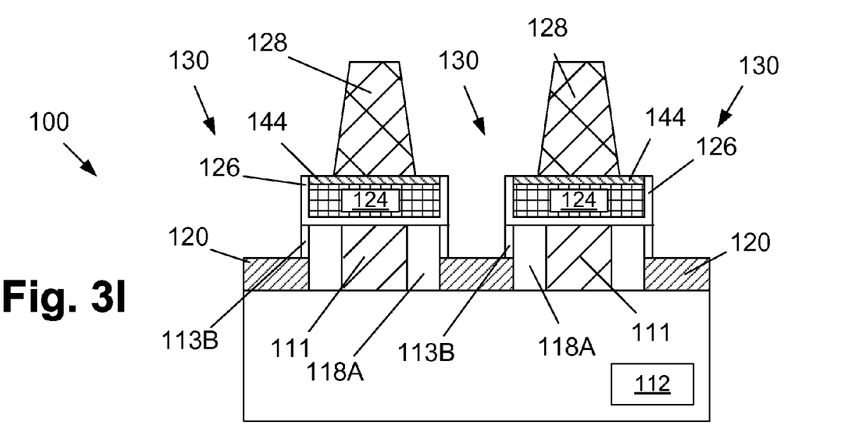

FIG. 3I depicts the device 100 after the above-described "punch through" etching process is performed to remove at least portions of the recessed etch stop layer 113A (as well as any other residual materials) so as to thereby expose the source/drain regions 120.

Figure 3J:
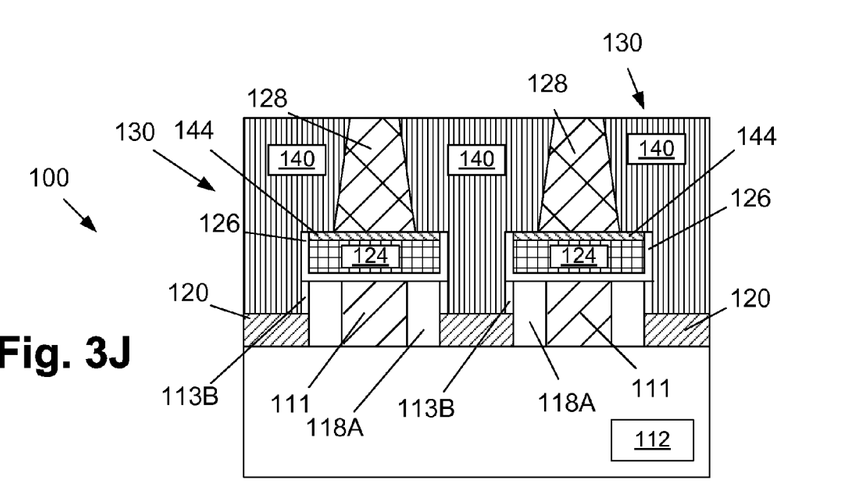

FIG. 3J depicts the product 100 after the above-described conductive, self-aligned contact structures 140 have been formed in the self-aligned contact openings 130 such that they are conductively coupled to the source/drain regions 120.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a device comprised of a gate structure and a spacer structure positioned in a layer of insulating material, the method comprising:
    performing at least one etching process to recess said gate structure and said spacer structure and thereby form an etched recessed gate structure and an etched recessed spacer structure, said etched recessed gate structure, said etched recessed spacer structure and said layer of insulating material defining a spacer/gate cap recess;
    forming a gate cap layer in said spacer/gate cap recess, said gate cap layer having a thickness that is less than a depth of said spacer/gate cap recess;
    forming a gate cap protection layer on an upper surface of said gate cap layer and above said layer of insulating material; and
    performing at least one process operation to remove portions of said gate cap protection layer from above said layer of insulating material while leaving a portion of said gate cap protection layer positioned on said upper surface of said gate cap layer.

2. The method of claim 1, wherein said gate cap layer is comprised of a material having a dielectric constant less than 7.

3. The method of claim 1, wherein said gate cap layer is comprised of a material having a dielectric constant less than 3.3.

4. The method of claim 3, wherein said gate cap protection layer is comprised of one of hafnium oxide, aluminum oxide, a metal-containing oxide or a material having a dielectric constant greater than 10.

5. The method of claim 1, wherein said gate cap protection layer is comprised of a material having a first dielectric constant and said gate cap layer is comprised of a material having a second dielectric constant, wherein said first dielectric constant is greater than said second dielectric constant.

6. The method of claim 1, wherein said gate cap layer comprises a plurality of sidewalls, each of which contact said layer of insulating material.

7. The method of claim 1, wherein said gate cap protection layer comprises a plurality of sidewalls, each of which contact said layer of insulating material.

8. The method of claim 1, wherein performing said at least one etching process to recess said gate structure and said spacer structure and thereby form the etched recessed gate structure and the etched recessed spacer structure comprises:
    performing a first etching process to recess one of said gate structure or said spacer structure relative to one another; and
    performing a second etching process to recess the other of said gate structure or said spacer structure.

9. The method of claim 1, wherein performing said at least one process operation to remove portions of said gate cap protection layer comprises performing a chemical mechanical planarization process to remove said portions of said gate cap protection layer.

10. A method of forming a device comprised of a gate structure and a spacer structure positioned in a layer of insulating material, the method comprising:
    performing at least one etching process to recess said gate structure and said spacer structure and thereby form a recessed gate structure and a recessed spacer structure, said recessed gate structure, said recessed spacer structure and said layer of insulating material defining a spacer/gate cap recess;
    forming a gate cap layer in said spacer/gate cap recess, said gate cap layer having a plurality of sidewalls that contact said layer of insulating material and a thickness that is less than a depth of said spacer/gate cap recess, wherein said gate cap layer is comprised of a material having a first dielectric constant;
    forming a gate cap protection layer on an upper surface of said gate cap layer and above said layer of insulating material, said gate cap protection layer being comprised of a material having a second dielectric constant, wherein said second dielectric constant is greater than said first dielectric constant; and
    performing at least one process operation to remove portions of said gate cap protection layer from above said layer of insulating material while leaving a portion of said gate cap protection layer positioned on said upper surface of said gate cap layer.

11. The method of claim 10, wherein said gate cap protection layer comprises a plurality of sidewalls, each of which contact said layer of insulating material.

12. The method of claim 10, wherein said gate cap layer is comprised of a material having a dielectric constant less than 3.3.

13. The method of claim 12, wherein said gate cap protection layer is comprised of one of hafnium oxide, aluminum oxide, a metal-containing oxide or a material having a dielectric constant greater than 10.

* * * * *